United States Patent [19]
Nakano et al.

[11] Patent Number: 4,463,216
[45] Date of Patent: Jul. 31, 1984

[54] SOLAR CELL

[75] Inventors: Hirotaka Nakano, Yokahama; Hiroshi Morita, Kawasaki; Taketoshi Kato, Tokyo, all of Japan

[73] Assignee: Tokyo Shibaura Denki Kabushiki Kaisha, Kawasaki, Japan

[21] Appl. No.: 459,586

[22] Filed: Jan. 20, 1983

[30] Foreign Application Priority Data

Jan. 28, 1982 [JP] Japan ................ 57-10954

[51] Int. Cl.$^3$ ............................ H01L 31/06
[52] U.S. Cl. .................... 136/256; 29/572; 357/30; 357/52; 357/54
[58] Field of Search ............ 136/256; 29/572; 427/74; 357/30, 52, 54

[56] References Cited

U.S. PATENT DOCUMENTS

| | | | |
|---|---|---|---|
| 3,982,265 | 9/1976 | Johnston, Jr. | 136/256 |
| 4,055,442 | 10/1977 | Crosher | 136/256 |
| 4,276,137 | 6/1981 | Hovel et al. | 204/164 |

FOREIGN PATENT DOCUMENTS 52-90288  7/1977  Japan ................ 136/256

OTHER PUBLICATIONS

I. Chambonleyron et al., "Properties of Chemically Sprayed SnO$_2$ Antireflecting Films on Si Solar Cells", *Solar Energy Mat'ls.*, vol. 1, pp. 299-311, (1979).

B. E. Yoldas et al., "Antireflective Coatings Applied from Metal-Organic Derived Liquid Precursors", *Applied Optics*, vol. 18, pp. 3133-3138, (1979).

*Primary Examiner*—Aaron Weisstuch
*Attorney, Agent, or Firm*—Oblon, Fisher, Spivak, McClelland & Maier

[57]  ABSTRACT

A solar cell and a method of manufacturing the same are disclosed. The solar cell has a semiconducor substrate having a major surface for receiving light, a p-n junction for photovoltatic generation therein and a thin alumina coating layer on the major surface of the semiconductor substrate. The alumina coating layer includes H radicals and OH radicals.

2 Claims, 10 Drawing Figures

SOLAR CELL

BACKGROUND OF THE INVENTION

1. Field of the Invention

This invention relates to solar cells and to a method of manufacturing the same.

2. Description of the Prior Art

The spectral energy of the solar radiation emitted from the sun generally has an energy intensity distribution as shown in a curve 100 of FIG. 1. In practice, the solar radiation energy distribution received at ground level has a distribution as shown by curve 102 in the same Figure, because a substantial amount of energy is partly absorbed by oxygen, carbon dioxide gas, or water vapour in the atmosphere, and partly scattered by molecules or atoms of the atmosphere. Curve 102 has a maximum value at a wavelength of about 500 nm. For silicon solar cells, the entire solar radiation energy shown in curve 102 is not utilized in practice for the generation of electric power. The silicon solar cell is sensitive to radiation of wavelengths between 350 and 1100 nm, and the spectral sensitivity curve and a maximum value thereof vary depending upon the silicon substrate, the crystal structure of the photoelectromotive force generating junction, the electronic structure and the manufacturing process.

At present, it is well known that research and development for matching the maximum in the spectral sensitivity distribution curve of the silicon solar cell to that of the maximum value of the spectral energy distribution of solar radiation energy is being actively carried out to increase the output of solar cells. On the other hand, it is also known in the art that an antireflective layer can be provided for increasing the output of a solar cell. Ideally, the reflectivity of the antireflective layer in a silicon solar cell, should be brought close to zero for the solar radiation of wavelengths between about 350 and 110 nm. Conventionally, a single antireflective layer of silicon monoxide, titanium dioxide or oxidized titanium, such as gas-reacted titanium monoxide or tanalum pentoxide, is used. But a single antireflective layer such as this cannot decrease the reflectivity sufficiently and therefore, the output of the solar cell cannot be increased satisfactorily.

For removing the above mentioned drawbacks, an antireflective layer having two different layers has been proposed in U.S. Pat. No. 4,055,422. FIG. 2 of this application shows such a solar cell, having an antireflective layer (104) comprising two layers (106 and 108). One layer (106) is made of a highly refractive material, such as titanium dioxide, having a refractive index of 2.35 to 2.40, and the other layer (108) is made of a low refractive index material, such as silicon oxide, having a refractive index of less than 1.7. The optical thickness nd (n=refractive index, d=real thickness) of layers 106 and 108 is equal to $\lambda_0/4$, wherein $\lambda_0$ is equal to, for example, 600 nm. A glass plate (110) is mounted on the antireflective layer (104) by means of an adhesive material layer (112) as a protective means.

A spectral reflectivity distribution curve of antireflective layer 104 having a two layer structure is shown in FIG. 3. This curve is plotted with theoretical spectral reflectivity values in which the assumption is made that the reflected light permeates through adhesive layer 112.

As described hereinabove, the structures of conventional antireflective layers are proposed from the viewpoint of reducing the optical spectral reflectivity. Considerations made by the inventors show that the antireflective layer affects largely the carriers in the silicon substrate (114) of the cell shown in FIG. 2. The silicon substrate (114) and the antireflective layer (104) have in common an interface (116). A substrate of one conductivity type, for example a p-type silicon substrate (114), contains a principal surface (radiation receiving surface). The next or surface layer (118) is of opposite conductivity type, e.g. n+ type and therebetween a p-n junction is formed. On the n+ layer 118, a surface electrode (120) is provided to collect carriers generated by the solar radiation in the silicon substrate. A first antireflective layer (106) is formed to cover the n+ layer (118). This first antireflective layer (106) affects the lifetime of the carriers in the adjacent n+ layer (118) by means of an interface level through interface 116. This phenomenon is substantially the same phenomenon as that in which an injected carrier is affected by the surface conditions of an oxide film in a MOS varactor diode. In the case of the MOS diode, the oxide film is $SiO_2$. When the recombination velocity of the carrier at the interface can be reduced and the lifetime of the carrier increased, the conversion efficiency of the solar cell is improved.

SUMMARY OF THE INVENTION

An object of the present invention is to provide a solar cell having increased conversion efficiency.

This invention provides a solar cell having a radiation transparent aluminum oxide coating layer on a principal surface. The aluminum oxide layer includes H radicals and OH radicals and contributes to reduce the recombination velocity of the carriers at the interface between the aluminum oxide layer and a semiconductor substrate. The aluminum oxide layer of the present invention thereby increases the conversion efficiency.

Further, the present invention provides a method of making a solar cell, comprising the following steps:

1st step; preparing a solution of an aluminum compound which can be converted to aluminum oxide by heat treatment;

2nd step; coating the solution on a principal surface of the silicon substrate by means of a method selected from the group consisting of rotative coating (spinning), dip coating and spray coating.

3rd step; heating the silicon substrate with the coated film at a relatively low temperature between 400° C. and 700° C. to change the coated film into a light-transparent aluminum oxide.

BRIEF DESCRIPTION OF THE DRAWINGS

The invention will be described in detail with reference to the accompanying drawings, wherein.

DETAILED DESCRIPTION OF THE PREFERRED EMBODIMENT

Figure 4:
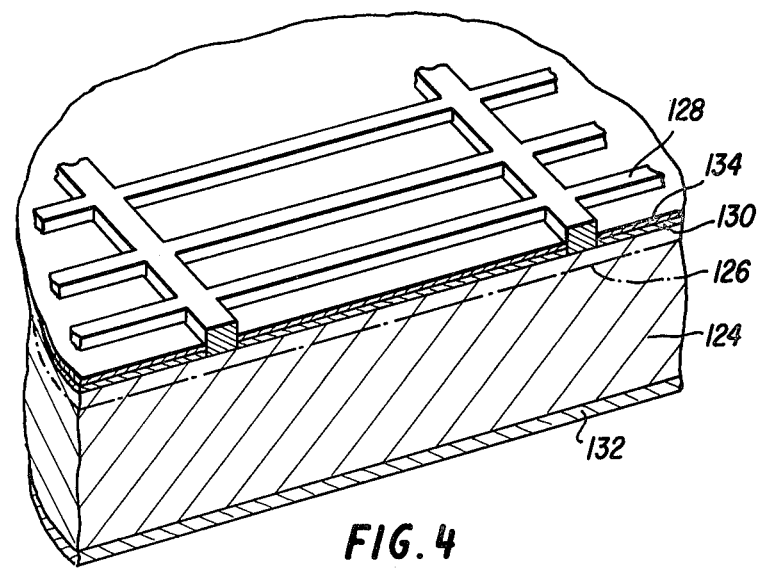
FIG. 4 illustrates a partially cut-off perspective view of one embodiment of the invention.

FIG. 4 shows one embodiment of the present invention. An n+ type layer (122) is provided by diffusion in one major surface region of a p-type conductive semiconductor substrate (124) to form a p-n junction (126). On the surface of the n+ type conductive layer (122), (i.e., on a principal surface which receives radiation) a grid-like metallic surface electrode (128) is provided. The portion of the principal surface other than that occupied by the metallic grid, is covered first with an aluminum oxide layer (130), and then with a tantalum pentoxide layer (134). Further, on the other principal surface of the substrate a rear side electrode (132) is provided.

The structure of the solar cell in this embodiment is as follows:

Silicon substrate/aluminum oxide layer/tantalum pentoxide layer/(atmosphere)   structure (1).

In this embodiment the thickness of the aluminum oxide coating layer is about 80 Å. Further, when it is assumed that the wavelength is 5000 Å, the refractive index of the tantalum pentoxide n is 2.2, nd is $\lambda_0/4$, and d becomes about 568 Å.

A manufacturing method of this solar cell will now be described.

For the silicon substrate, a p-type silicon single crystalline wafer with a thickness of 450 μm and a diameter of about 3 inches was used. After cleaning the wafer, phosphorus atoms were diffused into the p-type silicon wafer from a source of $POCl_3$ by means of a carrier gas comprising a mixture of nitrogen and oxygen. Diffusion conditions were, for example, 875° C. and 20 minutes. An n+ type layer was formed thereon and a p-n junction (126) thus also formed. The depth of the p-n junction was 0.3 μm. Then, an oxidized surface layer was removed by treatment with a hydrofluoric acid solution. A diffusion layer on the rear surface was also removed by applying a mixed acid comprised of one part of hydrofluoric acid, four parts of nitric acid and three parts of acetic acid. After that, the rear surface electrode (132) was formed by coating and baking of an aluminum paste such as A-3484 manufactured and sold by Engelhard Co., Ltd., followed by coating and baking of a silver paste such as A-2734 also from Engelhard Co. The aforesaid formation of the rear electrode may also be carried out by sputtering or evaporation of aluminum and silver. When the baking of aluminum paste was carried out at 830° C. in a nitrogen atmosphere for two minutes, a BSF (Back Surface Field) effect appeared and it played an important role in the efficiency improvement because of the increased open-circuit voltage or reduced dark current. The surface electrode was formed by evaporating 500 Å of titanium, 300 Å of palladium and 5μ of silver, in this order. In this process, the substrate was heated at 300° C. by means of resistance heating. Then the antireflective layer was formed. The formation of the antireflective layer was conducted by a dipping process.

For the formation of the aluminum oxide coating layer a first 6% aluminum nitrate solution was prepared, in which $Al(NO_3)_3$ was dissolved with methanol. Further, for the formation of the tantalum pentoxide layer, a 5% tantalum solution was prepared in which tantalum alkoxide $(Ta(OR)_4)$, tantalum chelate $(Ta(OH)_2(OCH-RCOOH)_2)$ and tantalum acylate $(Ta(OH)_3(OCOR)_2)$ were dissolved in a mixed solvent of ethanol $(C_2H_5OH)$ and ethyl-acetate $(CH_3COOC_2H_5)$, where R was $(C_nH_{2+1})$ and n was a mixture of n=2−8.

After the formation of electrode 128, the silicon substrate was dipped into and lifted from the aluminum oxide solution held at room temperature. After drying, the substrate was heated in an oxidizing atmosphere of 500° C. to form a strong and transparent thin film of aluminum oxide. The thickness of the film or layer can be controlled by means of the lifting speed of the substrate. The resultant thickness of the aluminum layer was selected to be 80 Å.

After that, the silicon substrate was dipped into the tantalum solution and the tantalum pentoxide layer was formed by the same process as the aluminum oxide layer.

Having now generally described the invention, a more complete understanding can be obtained by reference to certain specific examples, which are provided herein for purposes of illustration only and are not intended to be limiting unless otherwise specified.

EXAMPLES

EXAMPLE 1

The characteristics of the solar cell provided by the process described above were evaluated by irradiating with pseudo-solar radiation of 100 mW/cm² (condition AM 1). Measured results of the characteristics of the solar cells, including the first embodiment (structure (1)), a Comparative Example (structure (2)) and a control, which had no antireflective layer, are shown in Table 1 below. The Comparative Example (structure (2)) had the same structure as the embodiment (structure (1)) except for the absence of the aluminum oxide layer. Thus, in the Comparative Example the tantalum pentoxide layer was in direct contact with the surface of the silicon substrate. In other words, it was of the structure (2) shown below:

Silicon substrate/tantalum pentoxide layer/air   structure (2)

TABLE 1
CHARACTERISTICS OF DIFFERENT SOLAR CELLS

| Measured items | CONTROL | FIRST EMBODIMENT | COMPARATIVE EXAMPLE |
|---|---|---|---|
|  | (No anti reflective layer) | (structure 1) | (structure 2) |
| Voc (V) | 0.59 | 0.59 | 0.59 |
| Isc (A) | 0.95 | 1.41 | 1.34 |
| Vop (V) | 0.48 | 0.48 | 0.48 |
| Iop (A) | 0.89 | 1.32 | 1.25 |
| F F | 0.77 | 0.76 | 0.76 |
| η (%) | 9.61 | 14.24 | 13.50 |
| Rs (Ω) | 0.024 | 0.024 | 0.024 |
| Efficiency increase | — | 48 | 41 |

TABLE 1-continued

| | CHARACTERISTICS OF DIFFERENT SOLAR CELLS | | |
|---|---|---|---|
| | CONTROL | FIRST EMBODIMENT | COMPARATIVE EXAMPLE |
| (%) | | | |

In Table 1, Voc and Isc are open circuit voltage and a short circuit current respectively; Vop and Iop are operating circuit voltage and operating circuit current at maximum output respectively; F F, the fill factor, $\eta$ the conversion efficiency; and Rs, the series resistance respectively. As shown in Table 1, the first embodiment (structure 1) having the aluminum oxide layer is superior to the Comparative Example having only the antireflective layer. The thickness of the aluminum oxide layer was 80 Å in this embodiment. When the thickness of this layer is 100 Å or less, it does not adversely affect the spectral reflectivity characteristics.

EXAMPLE 2

A structure having an aluminum oxide layer and an antireflective layer comprised of two different layers is as shown in the following:

Si/Al$_2$O$_3$/Ta$_2$O$_5$/SiO$_2$/Air        structure (3).

Figure 1:
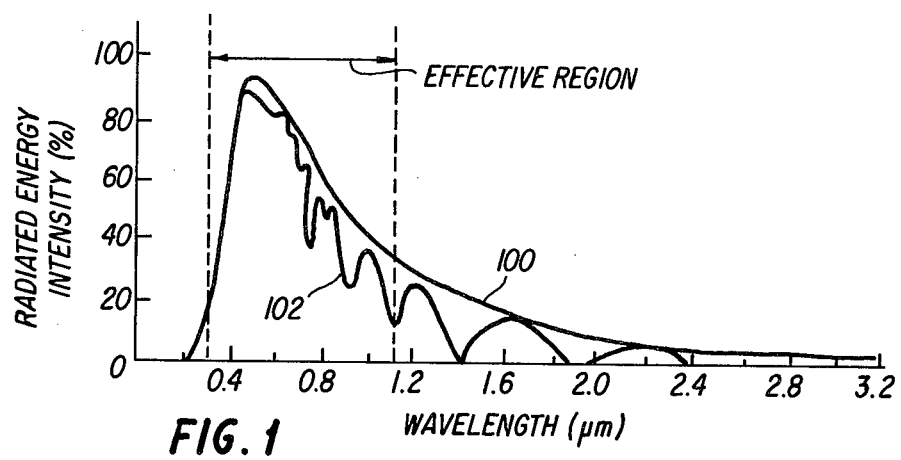
FIG. 1 illustrates the spectral energy distribution of solar radiation.
Figure 2:
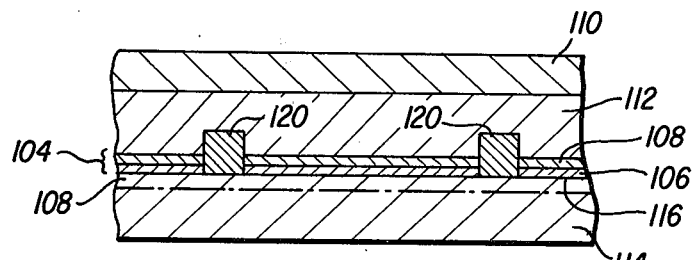
FIG. 2 illustrates a schematic sectional view of a prior art solar cell.
Figure 5:
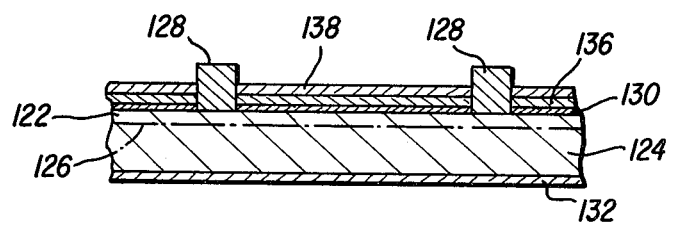
FIG. 5 illustrates a cross section of another embodiment of the invention.
Figure 3:
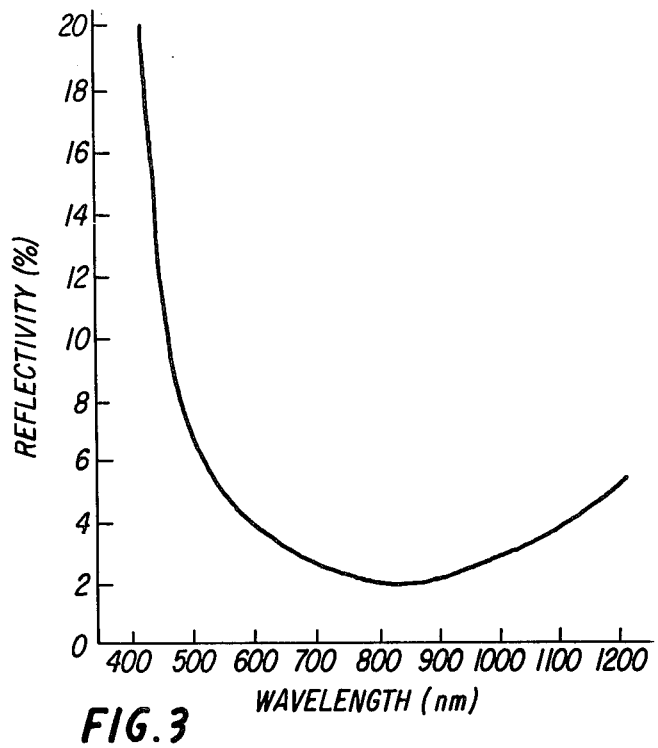
FIG. 3 illustrates the spectral reflectivity distribution characteristics of the conventional solar cell shown in FIG. 2.
Figure 6:
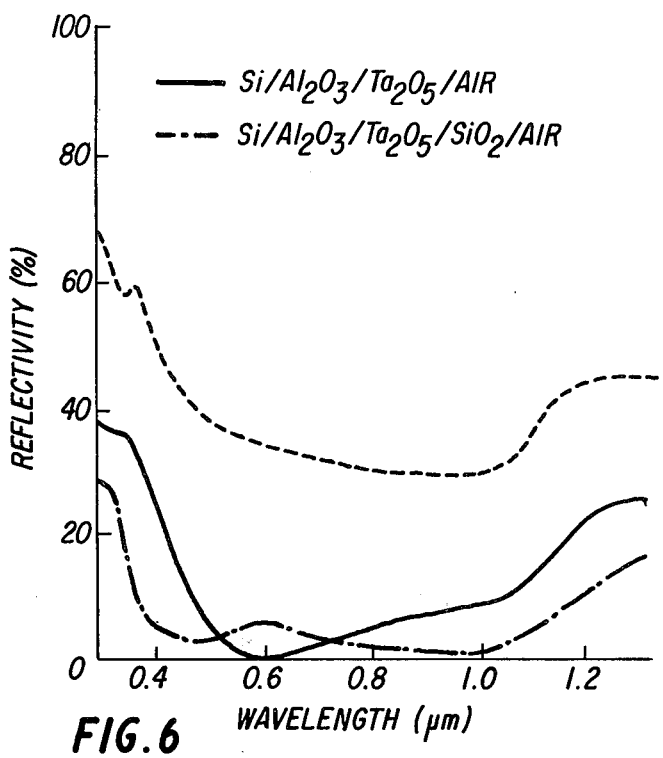
FIG. 6 illustrates the relation between the wave length and the reflectivity.

The optical thickness of each of the layers comprising tantalum pentoxide and silicon dioxide has a value of $\lambda_0/4$ ($\lambda_0=5000$ Å) and the thickness of the aluminum oxide layer has a value of less than 100 Å. This second embodiment is shown in FIG. 5. Numerals 136 and 138 denote the tantalum pentoxide layer and silicon dioxide layers respectively. The solar cell having structure (3) has an efficiency of 15.4%, which is greater than that of the Comparative Example (structure 2). Spectral reflectivity characteristics of the first embodiment (structure 1), the second embodiment (structure 3) and the control (structure without the antireflective layer) are shown in FIG. 6.

The first embodiment (structure 1), the second embodiment (structure 3), and the Comparative Example (structure 2) are structures in which radiation enters directly from atmospheric air. However, for solar cells of commercial power service, radiation enters through a cover glass adhered by an adhesive such as PVB (polyvinyl butyral). Therefore, the structures of third and fourth embodiments according to the invention are these shown in the following:

Si/Al$_2$O$_3$/Ta$_2$O$_5$/PVB/Glass/Air        (structure 4)

or,

Si/Al$_2$O$_3$/Ta$_2$O$_5$/SiO$_2$/PVB/Glass/Air        (structure 5)

wherein the thickness of the aluminum oxide layer contiguous the silicon substrate is below 100 Å, and the optical thicknesses of the tantalum pentoxide layer and the silicon dioxide layer in structure (5) are $\lambda_0/4$, wherein $\lambda_0=5000$ Å. The third and fourth embodiments (structures 4 and 5) are not shown in any of the figures of the present application.

Although a detailed description was made in the examples employing tantalum pentoxide as the antireflective layer, it is easily understood that other highly refractive materials such as titanium dioxide can be used for this purpose.

The manufacturing method according to the invention is described by exemplifying the dipping method. Other coating methods, such as rotative coating by spinning or spray coating, may be successfully used.

The effects of the presence of an aluminum oxide layer according to the invention, upon the characteristics of a solar cell are investigated in the following experiments.

The surface recombination velocity of minority carriers was measured by providing different metal oxide layers on silicon substrates having p and n type conductivities respectively, by means of a vacuum evaporation coating method, by coating from a solution, in particular a dip coating method. The measuring method adopted is the so called "non-contactive method", in which the decrease of minority carriers pulse injected into the sample is measured by means of a microwave probe. The principle and analysis of this method are detailed by Usami et al, in the Oyo Buturi vol. 49, No. 12 (1980), pp. 1192 (in Japanese).

Experiment 1: Surface recombination velocity at the interface between an n-type silicon substrate and the metal oxide thin film coated from a solution.

A thin film layer of titanium dioxide (TiO$_2$), tantalum pentoxide (Ta$_2$O$_5$), aluminum oxide (Al$_2$O$_3$) or silicon dioxide (SiO$_2$) was coated on four identical n-type silicon substrates respectively. Each silicon substrate had a thickness of 450$\mu$, a diameter of 3 inches, a lattice orientation of (100) and a specific resistivity of 3 $\Omega$cm and was manufactured by the Czochralski (Cz) method, by means of coating from a solution. The resulting thin film layers, together with their refractive indexes are shown in Table 2.

TABLE 2

| EFFECT OF COATING ON THE REFRACTIVE INDEX | | |
|---|---|---|
| Solute | Thin film layer | Refractive index |
| Ta(OR)$_5$ | Ta$_2$O$_5$ | 2.1 |
| Ti(O.iC$_3$H$_7$)$_4$ | TiO$_2$ | 2.2 |
| Al(NO$_3$)$_3$ | Al$_2$O$_3$ | 1.60 |
| Si(OR)$_4$ | SiO$_2$ | 1.47 |

Further details of the solutions used are as follows.

1. A 3.4% solution of titanium isopropoxide (Ti-(OC$_3$H$_7$)$_4$) as a titanic ester dissolved in a mixed solvent of ethanol and ethyl acetate (9:1) was used for the formation of the titanium dioxide thin film layer;

2. A 6% solution of aluminum nitrate dissolved in methanol is used for the formation of aluminum oxide layer;

3. A solution of silicate ester (Si(OR)$_4$) dissolved in a solvent which contains one or more solvents selected from a group consisting of methanol, ethanol, methyl acetate, and ethyl acetate is used for the formation of the silicon dioxide thin film layer; and 4. A 5% solution of tantalum compound, mainly tantalum alcoxide (Ta(OR)$_4$) was used, but also tantalum chelate (Ta(OH)$_2$.(OCHRCOOH)$_2$) or tantalum acylate (Ta(OR)$_3$(OCOR)$_2$) may be used, dissolved in a mixed solvent of ethanol (C$_2$H$_5$OH) and ethyl acetate (CH$_3$COOC$_2$H$_5$), for the formation of the tantalum pentoxide thin film layer. In these molecular formulas, R represents C$_n$H$_{2n+1}$, and in this embodiment a mixture of different kinds of substances can be used, including those where the value of n is between 2 and 8. But in this case, tantalum alkoxide only may be used without tantalum chelate and tantalum acylate. Also, for the tantalum alkoxide, tantalum propoxide (n=3) or tantalum butoxyde (n=4) respectively are used separately.

Figure 7:
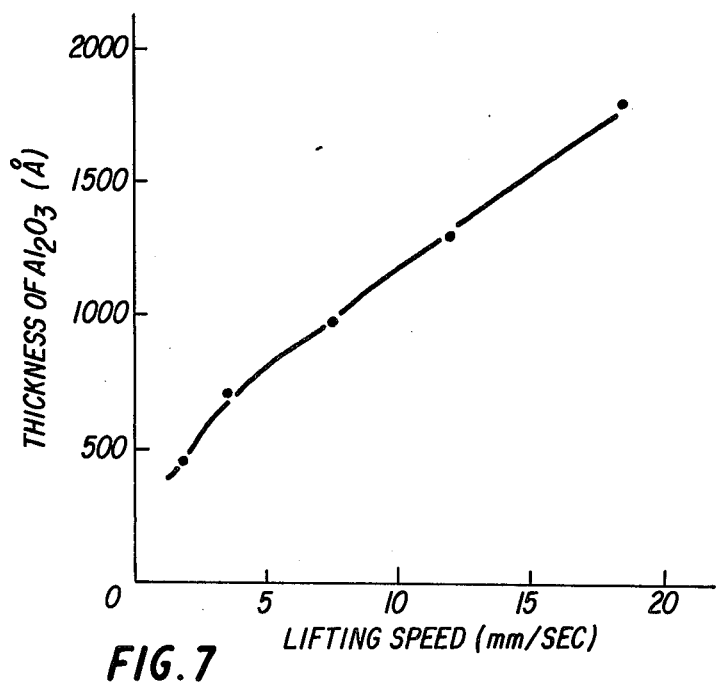
FIG. 7 illustrates a curve showing the relation between the lifting speed from a solution and a thickness of an aluminum oxide coating layer.

By dipping the silicon substrate into the coating solution, lifting therefrom and drying, a strong and transparent oxide thin film was formed upon heat treating the coated substrate at 500° C. in an atmosphere of air. The thickness of the film was controlled by means of the lifting speed of the substrate. The relation between lifting speed and film thickness after heat treatment at 500° C. in the formation of an aluminum oxide coating layer is shown in FIG. 7. In each of the cases where a coat of titanium dioxide, tantalum pentoxide, or silicon dioxide is applied almost the same relationship is obtained between the thickness of the layer and the lifting speed of the substrate as that shown in FIG. 7, e.g., a parabolic or a linear relation can be provided.

The life times ($\tau$b) of the minority carriers in the bulk and the surface recombination velocities for a substrate coated by different thin oxide films and the silicon substrate alone are shown in Table 3. Optical thicknesses of respective oxide layers in Table 3 are about equal to $\lambda_0/4 (\lambda_0 = 5000$ Å$)$.

TABLE 3
LIFE TIME OF MINORITY CARRIER AND SURFACE RECOMBINATION VELOCITY FOR n-TYPE SUBSTRATE

| Material | $\tau$b($\mu$sec) | S(cm/sec) |
|---|---|---|
| n-type silicon substrate alone | 30 | 950 |
| TiO$_2$ | 32 | 1250 |
| Ta$_2$O$_5$ | 30 | 250 |
| Al$_2$O$_3$ | 30 | 120 |
| SiO$_2$ | 32 | 700 |

Figure 8:
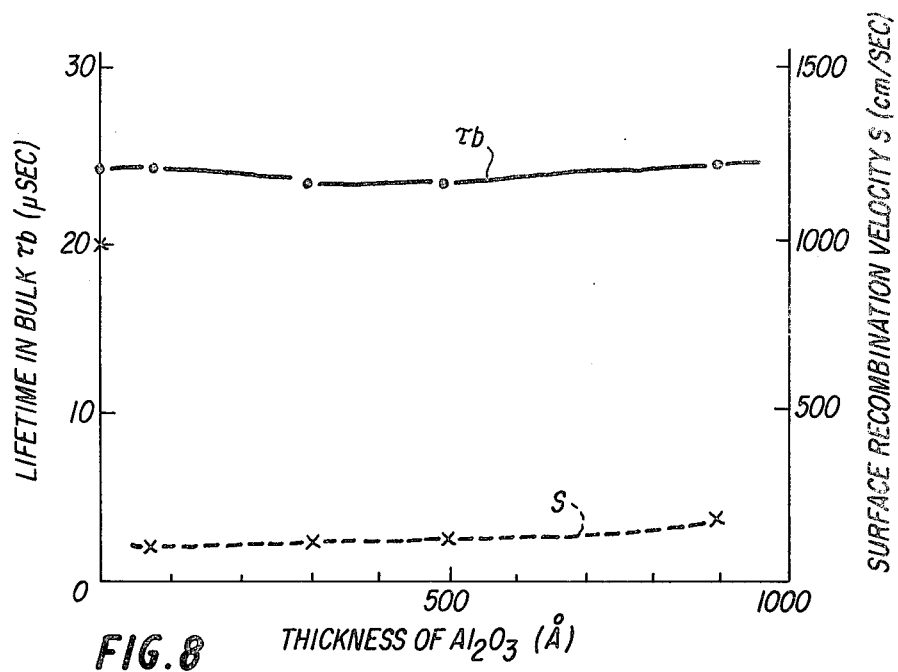
FIG. 8 illustrates relationship of the lifetime of minority carriers and the surface recombination velocity with the thickness of the aluminum oxide coating layer.

As clearly shown in Table 3, the life time ($\tau$b) of the minority carriers in the bulk does not substantially depend on the kind of oxide film, but the surface recombination velocity becomes a minimum and is thus improved when aluminum oxide is employed. The dependencies of $\tau$b and S upon the thickness of aluminum oxide layer for the aluminum oxide formed by heat treatment at 500° C. in the air are shown in FIG. 8. As clearly shown in FIG. 8, S does not substantially depend upon the thickness of the aluminum oxide film. In other words, the value S is determined by an interface condition between the silicon substrate and the aluminum oxide layer. After polishing a silicon substrate, an oxide film layer having a thickness of several Angstroms may be developed immediately, but it does not affect the contact between the silicon substrate and the aluminum oxide film layers.

Experiment 2: Surface recombination velocity in the case where the oxide film is formed on a p-type silicon substrate by means of a coating method.

The surface recombination velocity and the lifetime of the minority carrier in the bulk $\tau$b for a p-type substrate of thickness 450$\mu$, diameter 3 inches, crystal orientation (100), resistivity 4 ohm-cm, grown by the Czochralski method and coated with the different oxide film layers by a dipping method substantially the same as in Experiment-1 and for a silicon substrate with no oxide film layer are shown in Table 4. The optical thicknesses of the respective oxide layers in the Table are about $\lambda_0/4 (\lambda_0 = 5000$ Å$)$.

As apparent from the Table 4, the surface having the lowest value of recombination velocity is obtained when the aluminum oxide film layer is coated on the p-type silicon substrate. These results are similar to those obtained when coating the n-type substrate.

TABLE 4
LIFE TIME OF MINORITY CARRIER AND SURFACE RECOMBINATION VELOCITY FOR P-TYPE SUBSTRATE

| Material | $\tau$b($\mu$sec) | S(cm/sec) |
|---|---|---|
| p-type silicon substrate only | 100 | 1000 |
| TiO$_2$ | 100 | 2000 |
| Ta$_2$O$_5$ | 105 | 1350 |
| Al$_2$O$_3$ | 105 | 100 |
| SiO$_2$ | 100 | 1300 |

To investigate the mechanism leading to the observed improved value of S, an MOS varactor diode was prepared to determine the surface state density (N$_{FB}$) between Al$_2$O$_3$ and Si from the following equation.

$$N_{FB} = \frac{K_0 \epsilon}{qt_{ox}} (\phi MS - V_{FB})$$

wherein $\phi_{MS}$ is the work function difference between an electrode and a semiconductor substrate, q is the static charge of an electron, $t_{ox}$ is the thickness of the oxide film layer, $K_0$ is the permittivity of free space, $\epsilon$ is the dielectric constant, $V_{FB}$ is the flat band voltage determined from a capacity-voltage curve, the value of which is 0.6 V. The obtained value of $N_{FB}$ is $3.5 \times 10^{10}/cm^2$. This value is almost the same as that of $9 \times 10^{10}/cm^2$ usually obtained from the (100)Si, which proves that there is no excess charge in the layer. From these facts it is concluded that the improved value of S is not caused by the existence of a retarding field against the minority carriers, but is estimated to be the inactivation of a trap level from the data of temperature dependency of infrared absorption.

Figure 9:
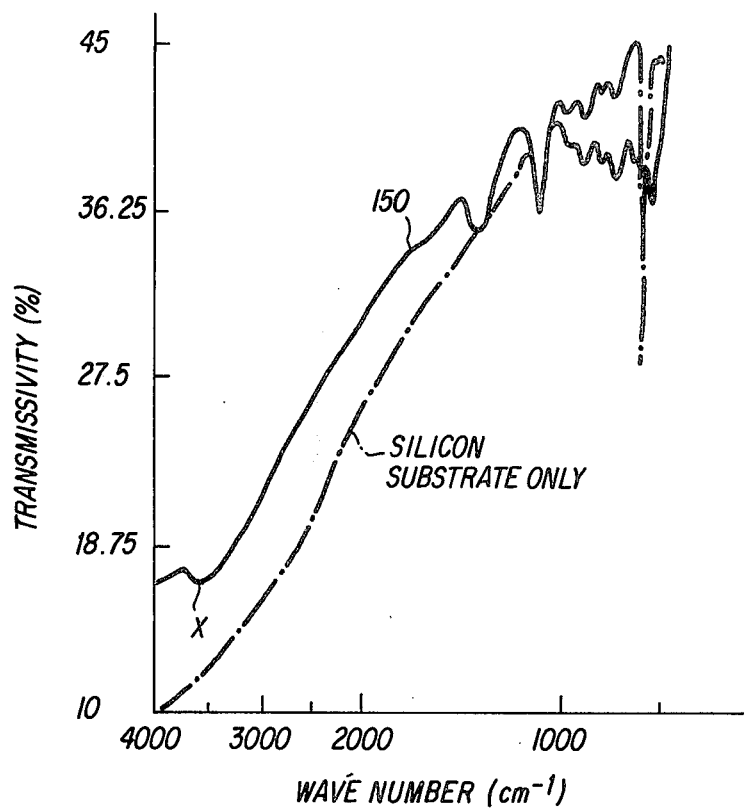
FIG. 9 illustrates the infrared absorbance characteristics of the aluminum oxide coating layer.

FIG. 9 shows the infrared absorption of a silicon wafer coated with aluminum oxide, whose optical thickness is $\lambda_0/4$ on both sides and which is anealed at a temperature of 600° C. Curve 150 shows the case of a silicon wafer coated with Al$_2$O$_3$. Curve 150 shows a depression X caused by OH-absorption. This shows that OH radicals are retained or trapped in the aluminum oxide coating layer, or in the interface between the aluminum oxide coating layer and the silicon wafer. In addition, 25 atom % of H was observed in the aluminum oxide layer by a nuclear reaction method. The radicals H or HO as well as their ions inactivate the surface states between the silicon and the aluminum oxide. The inactivation of the interface level prevents the carriers from being trapped by the interface and thereby decreases the velocity of recombination.

Figure 10:
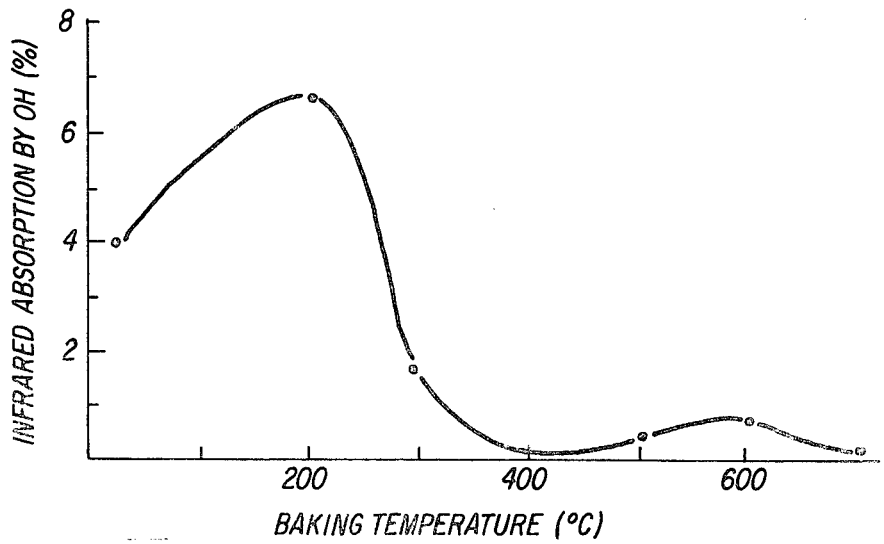
FIG. 10 illustrates the baking temperature dependency of the infrared absorbance characteristics of the aluminum oxide coating layer.

FIG. 10 shows the relation between the baking temperature of an aluminum compound coated from solution and the infrared absorption of the resultant aluminum oxide coating layer. The infrared absorption is larger in the range of baking temperatures below 400° C. than elsewhere. This results from the OH radicals contained not only at the interface between the aluminum oxide layer and the silicon substrate, but also in the aluminum oxide layer itself. The interface includes a surface region of the aluminum oxide layer adjacent to the substrate. Heat treatment above the temperature of 400° C. causes evaporation of OH radicals in the aluminum oxide layer, and thus only the OH radicals trapped by the interface remain. The OH radicals remaining in the aluminum oxide layer after a heat treatment of 400° C. or less are unstable thermally, and thus this type of heat treatment is undesirable. Heat treatment above 700° C. evaporates OH radicals at the interface. Therefore it is highly preferred that the heat treatment be carried out at a temperature of between 400° C. to 700° C. The preferred amount of H radicals and OH radicals is between 1 to 30 atom %.

Experiment 3: Surface recombination velocity when the oxide film layer is provided by vacuum evaporation.

In Table 5, $\tau b$ and S are shown for the n- and p-type silicon substrates on which aluminum oxide film layers having an optical thickness of $\lambda_0/4 (\lambda_0 = 5000$ Å$)$ are deposited by electron beam evaporation. During this evaporation, the temperature of the substrate was 300° C. and after that, no heat treatment was carried out for these substrates. The $\tau b$ and S values for these substrates are shown in Table 5. Even after the heat treatment, $\tau b$ and S values were not altered. From comparing Tables 3, 4 and 5, it is apparent that the surface recombination velocity (S) of the minority carriers for the substrate coated with aluminum oxide by the evaporation method is remarkably larger than that for the substrate coated from solution. Thus, the aluminum oxide film layer formed at a low temperature gives the best result.

TABLE 5
LIFE TIME OF MINORITY CARRIERS AND SURFACE RECOMBINATION VELOCITY IN VACUUM EVAPORATION

| Kind | $\tau b (\mu sec)$ | S(cm/sec) |
|---|---|---|
| upon n-type silicon | 30 | 2500 |
| upon p-type silicon | 105 | 3030 |

In the above described embodiment, aluminum nitrate ($Al(NO_3)_3$) is used as the solute of the aluminum compound solution. However, other solutes, for example aluminum chloride ($AlCl_3$), aluminum ammonium chloride ($AlCl_3 \cdot NH_4Cl$) or aluminum alkoxide ($Al(OR)_3$), can be used. As an aluminum alkoxide, $Al(OCH_2C(CH_2)_2CH_3)$ and $Al(OCH(CH_3)_2)_3$ can be used.

As discussed above, the present invention provides a solar cell of high performance and a method of manufacturing this cell.

Having now fully described the invention, it will be apparent to one of ordinary skill in the art that many changes and modifications can be made thereto without departing from the spirit or scope of the invention as set forth therein.

What is claimed as new and desired to be secured by Letters Patent of the United States is:

1. A solar cell comprising:
    a semiconductor substrate having a major surface for receiving light and a p-n junction for photovoltaic generation; wherein
    an aluminum oxide coating layer is formed on said major surface; said aluminum oxide coating layer having H radicals or OH radicals in amounts of 1 to 30 atom %, and being substantially in contact with said major surface, wherein an antireflective layer is further provided over said aluminum oxide coating layer.

2. A solar cell according to claim 1, wherein said aluminum oxide coating layer is less than 100 Å in thickness.

* * * * *